(12) United States Patent
Treutler et al.

(10) Patent No.: US 6,534,978 B1
(45) Date of Patent: Mar. 18, 2003

(54) ELECTRONIC COMPONENT

(75) Inventors: Christoph Treutler, Wannweil (DE); Franz Jost, Stuttgart (DE); Martin Freitag, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/530,698

(22) PCT Filed: Mar. 27, 1999

(86) PCT No.: PCT/DE99/00934

§ 371 (c)(1),
(2), (4) Date: May 3, 2000

(87) PCT Pub. No.: WO00/17660

PCT Pub. Date: Mar. 30, 2000

(30) Foreign Application Priority Data

Sep. 22, 1998 (DE) .......................... 198 43 350

(51) Int. Cl.⁷ ............................... G01R 33/02
(52) U.S. Cl. ...................... 324/252; 338/32 R
(58) Field of Search ............... 324/207.21, 207.24, 324/207.25, 252, 360; 338/32 H, 32 R

(56) References Cited

U.S. PATENT DOCUMENTS 5,789,919 A    8/1998  Yokotani ............... 324/207.21
5,936,882 A  * 8/1999  Dunn .......................... 365/158

FOREIGN PATENT DOCUMENTS

EP     0 450 829 A    10/1991

OTHER PUBLICATIONS

Brown J. L. Et Al: "1–MB Memory Chip Using Giant Magnetoresistive Memory Cells", IEEE Transactions on Components, Packaging and Manufacturing Technology: Part A, BD. 17, NR. 3, Sep. 1, 1994, pp. 373–379.

* cited by examiner

Primary Examiner—Jay Patidar
(74) Attorney, Agent, or Firm—Michael J. Striker

(57) ABSTRACT

An electronic element, in particular a chip element, with at least one first magnetoresistive element that is disposed on a substrate and fulfills a sensor function and with at least one second magnetoresistive element that is disposed on the substrate and fulfills a memory function.

4 Claims, 1 Drawing Sheet

ELECTRONIC COMPONENT

BACKGROUND OF THE INVENTION

The current invention relates to an electronic component, in particular a chip element.

It is known to produce sensors that function in a contactless manner, e.g. for the detection of measurement quantities such as speed, angle, or path, by means of magnetic thin film technology. Worth particular mention in this regard are AMR thin film technology using the properties of anisotropic magnetoresistive sensor materials. The use of so-called GMR materials (giant magnetoresistance) has turned out to be particularly advantageous.

By using virtually identical technology, a generically related functional layer material is used to produce magnetic memory elements, so-called MRAMs (magnetic random access memory). In comparison to conventional memory elements, these MRAMs have the advantage that on the one hand, they can be very rapidly read and rewritten and on the other hand, they are in a position to retain their memory content without permanent power supply.

In the sensors described above, it turns out to be disadvantageous that the disposition of individual sensor elements on a substrate, which disposition is necessary for their function, takes up a lot of space. For example, in known AMR or GMR angle sensors, the functional layer is comprised of long, meandering strip conductors which must be laid exactly in relation to one another geometrically in order to receive a suitable measurement signal. This produces large intermediate spaces which makes the sensor as a whole large.

SUMMARY OF THE INVENTION

Therefore, the object of the invention is an improved usage of the space occupied by a magnetoresistively functioning sensor.

The objects of the present invention are attained by an electronic component, particularly a chip element comprising first magnetoresistive elements disposed on a substrate and having a sensor function, and at least one second magnetoresistive elements having a memory function, said first magnetoresistive elements consisting of elongated meandering strip conductors which are disposed in relation to each other exactly geometrically to obtain signals to be measured, wherein intermediary spaces are formed between said first magnetoresistive elements having said sensor function on said substrate, and said second magnetoresistive elements having said memory function are arranged in said intermediary spaces between said first magnetoresistive elements having said sensor function.

According to the invention, it is now possible to make sensible use of the large amount of space required in magnetoresistively functioning sensors. According to the invention, free areas between sensor components can be used for memory elements. In comparison to a separate production of the sensor and memory, different components such as housings can be saved, which can reduce costs.

Suitably, the at least one first magnetoresistive element is an AMR sensor or element or a GMR sensor or element. As a rule, elements of this kind are comprised of long, meandering strip conductors which are disposed exactly in relation to one another geometrically. For example, in order to produce sine and cosine signals of an angle to be measured (by means of an external magnetic field associated with the angle to be measured) two AMR sensor elements are disposed at an angle of 45° in relation to each other, wherein the angle associated with the sine and cosine signals can be determined by using the arc tan function. With a device of this kind, intermediary spaces are necessarily produced between the sensor elements on the chip surface or the substrate, which can be advantageously used according to the invention to form memory elements. Since the memory elements have significantly smaller dimensions than the sensor elements, the available area can be optimally utilized.

According to a preferred embodiment of the invention, the at least one second magnetoresistive element is an MRAM cell. Cells of this kind have particularly small dimensions and can be simply disposed between sensor elements on the substrate. MRAM cells of this kind have the same layer structure as certain AMR or GMR sensor elements so that it is particularly easy to equip a substrate in this instance.

In a suitable fashion, the component according to the invention has an integrated set of control and evaluation electronics for the sensor function and/or the memory function. This produces a particularly compact component.

According to an advantageous embodiment of the component according to the invention, the at least one second magnetoresistive element can store data for executing and/or controlling and/or adjusting the sensor function of the at least one first magnetoresistive element. For example in angle sensors, the memory area can be significantly increased by virtue of the fact that the number of revolutions occurring or measured can be stored in the integrated memory. A particular advantage is based on the fact that the power supply of this kind of sensor and memory elements can be interrupted without signal loss. The memory content and a current sensor signal are immediately available again when operation is resumed. In magnetoresistively functioning path sensors in which a magnetoresistive element scans a periodic magnetic field pattern, the number of periods detected can be stored in a memory and can be supplied to a set of evaluation electronics in a relatively rapid fashion.

Furthermore, offsets that occur, for example when there are a number of magnetoresistively functioning sensors, are corrected by means of an expensive thin film compensation. According to the invention, offset data or compensation data can be stored in the integrated memory elements. Conventional measures or electronic compensation processes such as focal length calibration, zener zapping, thyristor zapping, etc. can be easily replaced. Moreover, arbitrary characteristic signal data can be stored in the memory elements. Through the use of MRAM memory cells, data of this kind can be quickly accessed and can be updated, for example, in order to adapt the functional parameters (offset, sensitivity, operating point) or in order to execute an adaptive signal correction or a calibration. The stored data can also be used within the framework of a self-diagnosis of the sensor.

BRIEF DESCRIPTION OF THE DRAWINGS

A preferred embodiment of the invention will now be explained in detail in conjunction with the accompanying drawings.

DETAILED DESCRIPTION OF THE PREFERRED EMBODIMENT

Figure 1:
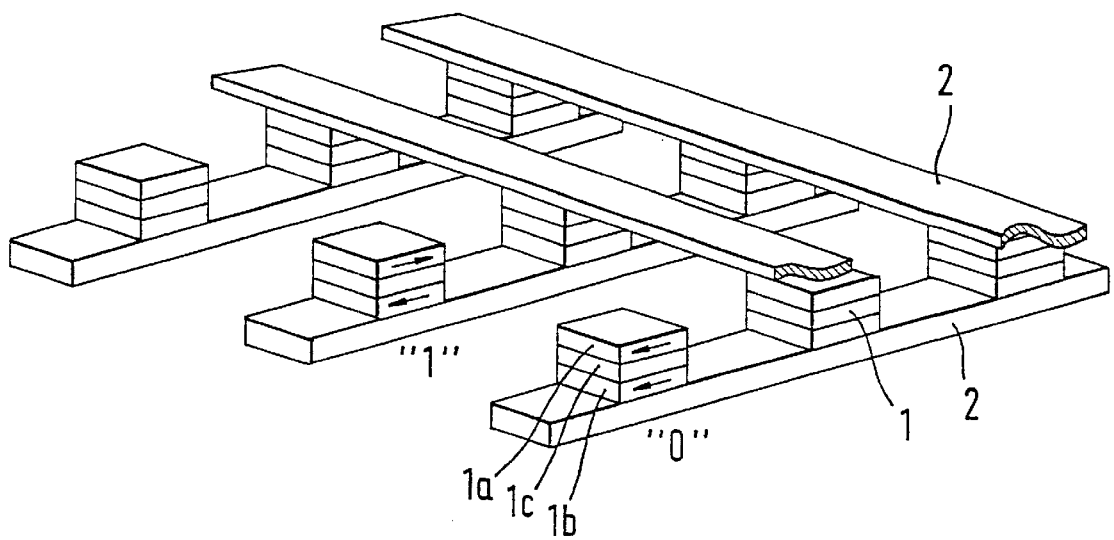
FIG. 1 shows a perspective, schematic design of a memory elements composed of MRAM cells.

FIG. 1 schematically depicts the design of an MRAM memory element in conjunction with a GMR three-layer system. A substrate, on which the depicted structure is usually disposed, is not shown. Individual MRAM cells 1 (embodied as GMR cells) are connected to one another in the manner shown by means of upper and lower strip conductors 2. The cells 1 have two magnetic layers 1a, 1b and a non-magnetic intermediary layer 1c. The layer 1a is typically made of a soft magnetic material and the layer 1c is typically made of a hard magnetic material. The magnetization directions of the layers 1a, 1c can be aligned parallel or antiparallel to each other depending on the impingement of current on the strip conductors 2. This technique is known in and of itself and is described for GMR cells, for example, in the article "1 Mb Memory Chip Using Giant Magnetoresistive Memory Cells" by J. L. Brown and A. V. Pohm, which appeared in IEEE Transactions on Components, Packaging and Manufacturing Technology, Part A, Vol. 17, No. 3, September 1994. In the example depicted, a parallel aligned magnetization corresponds to a logical "0" and an antiparallel alignment corresponds to a logical "1".

Figure 2:
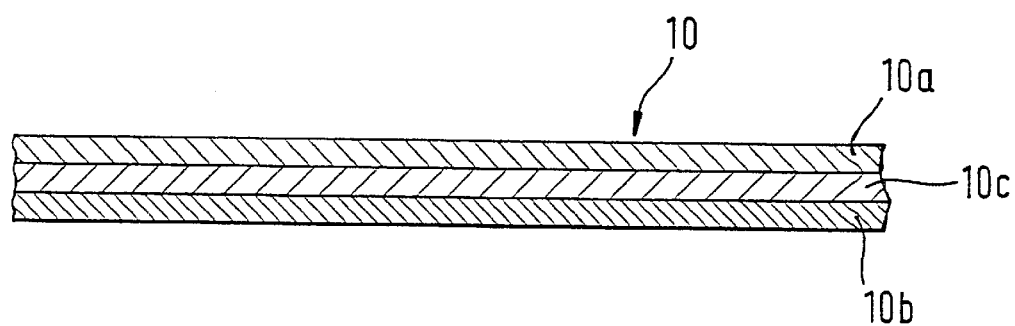
FIG. 2 shows a schematic design of a magnetoresistive sensor element.

A magnetoresistive sensor element 10 (schematically depicted in FIG. 2) can be produced a similar manner. In this connection, the logical states labeled "0" and "1" in FIG. 1 are not used, but rather magnetization directions which have a definite relationship with an external magnetic field. The sensor element 10 has a first thin magnetization layer 10b which defines a reference direction. The magnetization layer 10b is embodied as a hard magnetic layer. It can also be produced, for example, by means of an automatically stabilizing coupling (through the use of a synthetic antiferromagnet). The magnetization direction in the layer 10b is essentially independent of an external magnetic field to be measured. The layer 10b is adjoined by a thin intermediary layer 10c made of non-magnetic material which is in turn adjoined by a detection layer 10a that has a magnetization. As a rule, the detection layer 10a is a thin layer made of soft magnetic material. It essentially aligns its magnetization in accordance with the magnetization direction of an external field to be measured. The angle to be determined is then associated with the angle between the magnetization direction of the layer 10a when the adjacent external field is placed against it and the magnetization direction of the reference layer 10b.

Due to their similar or identical layer structure, the above-described sensor and memory elements can be produced on a substrate or chip in a single work cycle by using essentially the same technology. This permits the achievement of the above-described cost and space savings as well as the functional advantages shown.

What is claimed is:

1. An electronic component, particularly a chip element, comprising at least two first magnetoresistive element (10) disposed on a substrate and having a sensor function to measure a magnetization direction of an external magnetic field, and at least one second magnetoresistive element (1) disposed on said substrate and having a memory function, whereby an intermediary space is formed between said at least two first magnetoresistive elements (10) on said substrate, and whereby said at least one second magnetoresistive element (1) is arranged in said intermediary space, said second magnetoresistive element being in electrical contact with said first magnetoresistive element.

2. The component according to claim 1, wherein at least one of said first magnetoresistive elements (10) is an AMR element or a GMR element.

3. The component according claim 1, wherein said at least one second magnetoresistive element (1) is an MRAM cell.

4. The component according to claim 1, wherein data for executing, controlling or adjusting the sensor function first magnetoresistive element (10) can be stored in said at least one second magnetoresistive element (1).

* * * * *